(12) United States Patent
Sakane et al.

(10) Patent No.: US 10,832,891 B2
(45) Date of Patent: Nov. 10, 2020

(54) PLASMA PROCESSING APPARATUS AND PLASMA PROCESSING METHOD

(71) Applicant: Tokyo Electron Limited, Tokyo (JP)

(72) Inventors: Ryota Sakane, Miyagi (JP); Hideyuki Kobayashi, Miyagi (JP); Hiroshi Nagahata, Miyagi (JP); Jungwoo Na, Gyeonggi-do (KR)

(73) Assignee: Tokyo Electron Limited, Tokyo (JP)

( * ) Notice: Subject to any disclaimer, the term of this patent is extended or adjusted under 35 U.S.C. 154(b) by 29 days.

(21) Appl. No.: 15/831,564

(22) Filed: Dec. 5, 2017

(65) Prior Publication Data

US 2018/0158650 A1 Jun. 7, 2018

(30) Foreign Application Priority Data

Dec. 7, 2016 (JP) ................... 2016-237635

(51) Int. Cl.
*H01J 37/32* (2006.01)
*H01L 21/02* (2006.01)
(Continued)

(52) U.S. Cl.
CPC .... *H01J 37/32082* (2013.01); *C23C 16/4585* (2013.01); *C23C 16/4586* (2013.01); *C23C 16/505* (2013.01); *H01J 37/32449* (2013.01); *H01J 37/32651* (2013.01); *H01J 37/32715* (2013.01); *H01L 21/0228* (2013.01);
(Continued)

(58) Field of Classification Search
CPC ........... H01J 37/32082; H01J 37/32651; H01J 37/32449; H01J 37/32715; H01J 2237/334; C23C 16/4586; C23C 16/505; C23C 16/4585; H01L 21/31144; H01L 21/02211; H01L 21/31116; H01L 21/31122; H01L 21/02164; H01L 21/0332; H01L 21/0228; H01L 21/02274; H01L 21/02219;
(Continued)

(56) References Cited

U.S. PATENT DOCUMENTS 5,647,912 A * 7/1997 Kaminishizono ............ H01J 37/32009 118/719
9,048,178 B2 * 6/2015 Kubota ............. H01L 21/76811
(Continued)

FOREIGN PATENT DOCUMENTS

CN 103021907 4/2013
JP 2004022988 A * 1/2004
(Continued)

*Primary Examiner* — Rudy Zervigon
(74) *Attorney, Agent, or Firm* — IPUSA, PLLC

(57) ABSTRACT

A plasma processing apparatus includes a process chamber, and a pedestal provided in the process chamber and configured to hold a substrate. The plasma processing apparatus includes a first gas supply part configured to be able to supply a first gas from a location facing the pedestal, and a radio frequency power source configured to convert the first gas to plasma. A shield part to block the first gas converted to plasma is provided around the pedestal. The plasma processing apparatus further includes an evacuation part configured to evacuate the process chamber through the shield part, and a second gas supply part configured to be able to supply a second gas to a space between the shield part and the evacuation part.

6 Claims, 9 Drawing Sheets

(51) Int. Cl.
*H01L 21/311* (2006.01)
*H01L 21/033* (2006.01)
*C23C 16/458* (2006.01)
*C23C 16/505* (2006.01)
*H01L 21/3065* (2006.01)
*H01L 21/67* (2006.01)
*H01L 21/683* (2006.01)

(52) U.S. Cl.
CPC .. *H01L 21/02164* (2013.01); *H01L 21/02211* (2013.01); *H01L 21/02219* (2013.01); *H01L 21/02274* (2013.01); *H01L 21/0332* (2013.01); *H01L 21/31116* (2013.01); *H01L 21/31122* (2013.01); *H01L 21/31144* (2013.01); *H01J 2237/334* (2013.01); *H01L 21/3065* (2013.01); *H01L 21/67069* (2013.01); *H01L 21/6831* (2013.01); *H01L 21/6833* (2013.01)

(58) Field of Classification Search
CPC ............. H01L 21/6831; H01L 21/3065; H01L 21/67069; H01L 21/6833
USPC ........ 118/663, 695, 696; 156/345.24, 345.26
See application file for complete search history.

(56) References Cited

U.S. PATENT DOCUMENTS

| | | |
|---|---|---|
| 2010/0112496 A1 | 5/2010 | Nakajima et al. |
| 2013/0075390 A1 | 3/2013 | Ashida |
| 2017/0009338 A1* | 1/2017 | Saito .................... H01L 21/0217 |
| 2017/0069473 A1* | 3/2017 | Saito ................. H01J 37/32899 |
| 2017/0236690 A1* | 8/2017 | Hirano .............. C23C 16/45544 |
| | | 156/345.41 |

FOREIGN PATENT DOCUMENTS

| | | |
|---|---|---|
| JP | 2004-080033 | 3/2004 |
| JP | 2007-173824 | 7/2007 |
| JP | 2009-016814 | 1/2009 |
| JP | 2015-188061 | 10/2015 |
| TW | 200913010 | 3/2009 |

\* cited by examiner

PLASMA PROCESSING APPARATUS AND PLASMA PROCESSING METHOD

CROSS-REFERENCE TO RELATED APPLICATIONS

This patent application is based upon and claims priority to Japanese Patent Application No. 2016-237635, filed on Dec. 7, 2016, the entire contents of which are incorporated herein by reference.

BACKGROUND OF THE INVENTION

1. Field of the Invention

The present invention relates to a plasma processing apparatus and a plasma processing method.

2. Description of the Related Art

Plasma etching is performed to transfer etching mask patterns such as resist masks formed on etching target films by using photolithography technologies, to the etching target films. Critical dimensions of the patterns formed in the etching target films depend on resolutions of photolithography to the resist masks.

In recent years, along with the high-density integration of electronic devices, forming fine patterns that are smaller than the resolution limits of the photolithography to the resist masks is demanded. As one of methods of forming such fine patterns, Japanese Laid-Open Patent Application No. 2004-080033 discloses a method of performing processes of depositing a silicon oxide film on a resist mask formed on an etching target film and etching the etching target film with plasma by using the resist mask as an etching mask.

Atomic Layer Deposition (ALD) is known as a method of depositing a silicon oxide film on a resist mask. In ALD, a silicon oxide film is deposited on a resist mask by repeating processes of adsorbing a silicon-containing gas, which is a deposition source (precursor), on the resist mask, and supplying oxygen radicals generated from an oxygen-containing gas, which is a reaction gas, to the adsorbed silicon-containing gas.

Moreover, in ALD, as disclosed in Japanese Laid-Open Patent Application Publication No. 2009-016814, a conformal silicon oxide film can be deposited on a resist mask film by using an aminosilane based gas as the silicon-containing gas. This occurs because the aminosilane based gas adsorbs on a surface of the resist mask film or a surface of the silicon oxide film by substitution reaction of replacing a hydroxyl group with the aminosilane based gas and because polymerization does not occur any further until the aminosilane based gas is oxidized.

In the meantime, plasma processing apparatuses that can supply the aminosilane based gas, have a so-called post mix structure that is structured to have an aminosilane based gas supply pipe and the other process gas supply pipe (e.g., oxygen gas) separately from each other. This structure is taken because the aminosilane based gas has high reaction properties and therefore when the aminosilane based gas and the other process gas are supplied into the same pipe, the aminosilane based gas adsorbed on the inside of the pipe reacts with the other process gas, thereby depositing a reaction product on the inside of the pipe. Moreover, the reaction product deposited inside the pipe is difficult to be removed by cleaning. Furthermore, when a location of the pipe is close to a plasma region, an abnormal discharge may be caused.

In addition, even in the plasma processing apparatus having the post-mix structure, when supplying the other process gas without supplying the aminosilane based gas, the other process gas is liable to flow into the aminosilane based gas supply pipe. Therefore, to prevent the other process gas from flowing into the aminosilane based gas supply pipe, an inert gas is supplied into the aminosilane based gas supply pipe instead when the aminosilane based gas is not supplied into the aminosilane based gas supply pipe.

However, when performing the film deposition process by ALD and the etching process by using the same plasma processing apparatus, the inert gas supplied to the plasma region through the aminosilane based gas supply pipe sometimes acts as an additive gas. When the inert gas serves as the additive gas in the etching process, sometimes, preferable etching shapes cannot be obtained due to a decrease in mask selectivity and an increase in Line Edge Roughness (LER).

SUMMARY OF THE INVENTION

Accordingly, an embodiment of the present invention provides a post-mix structured plasma processing apparatus that can acquire a preferable etching shape.

According to one embodiment of the present invention, there is provided a plasma processing apparatus that includes a process chamber, and a pedestal provided in the process chamber and configured to hold a substrate. The plasma processing apparatus includes a first gas supply part configured to be able to supply a first gas from a location facing the pedestal, and a radio frequency power source configured to convert the first gas to plasma. A shield part to block the first gas converted to plasma is provided around the pedestal. The plasma processing apparatus further includes an evacuation part configured to evacuate the process chamber through the shield part, and a second gas supply part configured to be able to supply a second gas to a space between the shield part and the evacuation part.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

DETAILED DESCRIPTION OF THE PREFERRED EMBODIMENTS

Figure 1:
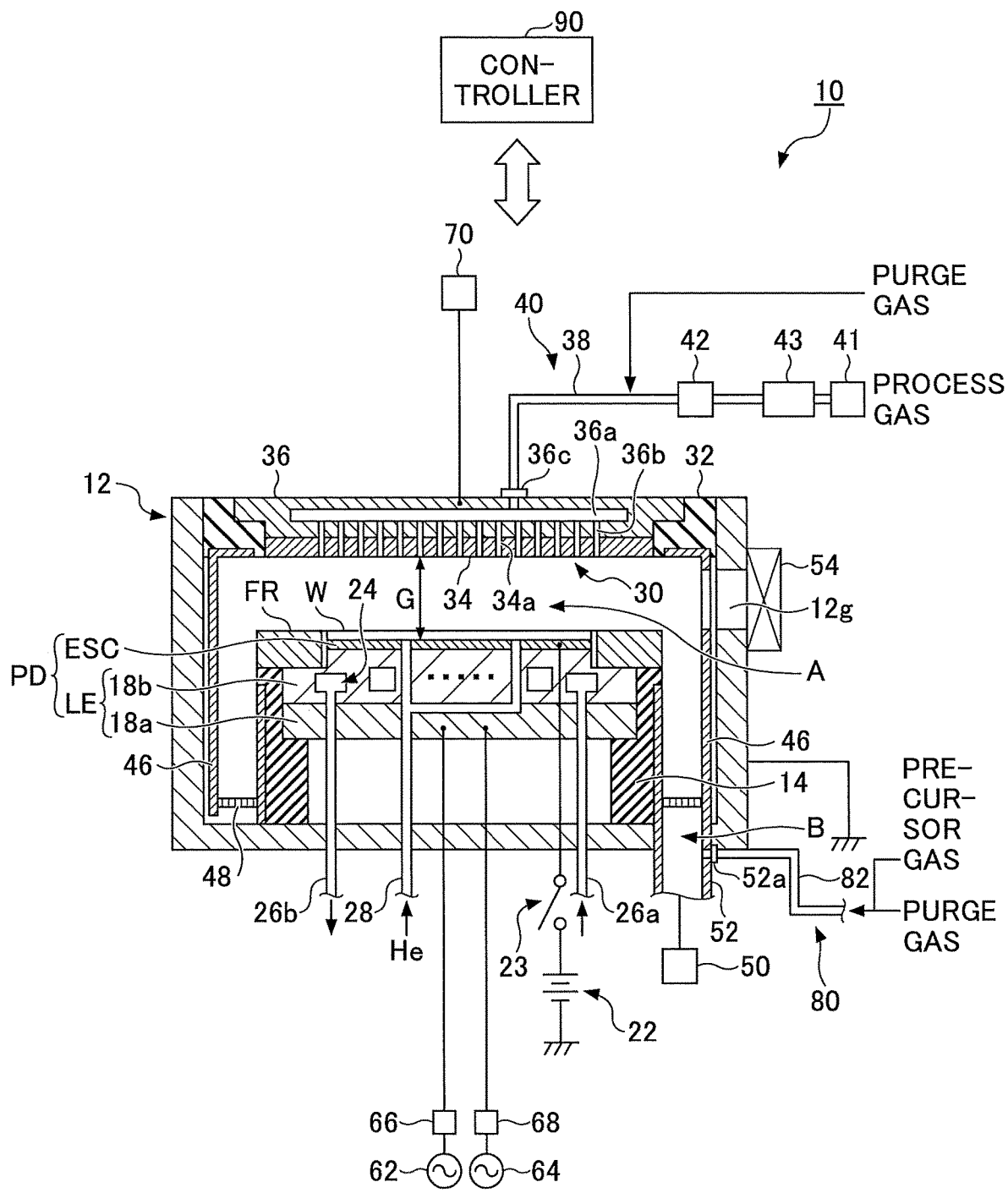
FIG. 1 is a schematic cross-sectional view illustrating a plasma processing apparatus according to an embodiment of the present invention.

A description is given below of embodiments of the present invention, with reference to accompanying drawings. Note that elements having substantially the same functions or features may be given the same reference numerals and overlapping descriptions thereof may be omitted.

[Overall Configuration of Etching Processing Apparatus]

To begin with, a plasma processing apparatus 1 according to an embodiment of the present invention is described below with reference to FIG. 1. FIG. 1 is a schematic cross-sectional view illustrating a plasma processing apparatus according to the embodiment.

As illustrated in FIG. 1, the plasma processing apparatus 10 is configured as a capacitively-coupled plasma etching apparatus, and includes a process chamber 12 that has an approximately cylindrical shape. The inner wall of the process chamber 12 is made of, for example, anodized aluminum. The process chamber 12 is grounded.

A support 14 having an approximately cylindrical shape is provided on the bottom surface of the process chamber 12. The support 14 extends upward in a vertical direction from the bottom surface of the process chamber 12. A pedestal PD is provided in the process chamber 12. The pedestal PD is supported by the support 14.

The pedestal PD holds a semiconductor wafer (which is referred to as a "wafer W" hereinafter) on its upper surface. The pedestal PD includes a lower electrode LE and an electrostatic chuck ESC. The lower electrode LE includes a first plate 18a and a second plate 18b. The first plate 18a and the second plate 18b are made of a metal such as aluminum, and are formed into an approximately disk shape. The second plate 18b is provided on the first plate 18a, and is electrically connected to the first plate 18a.

The electrostatic chuck ESC is provided on the second plate 18b. The electrostatic chuck ESC is structured to include an electrode made of a conductive film disposed between a pair of insulating layers or insulating sheets. A direct-current power source 22 is electrically connected to the electrode of the electrostatic chuck ESC via a switch 23. The electrostatic chuck ESC attracts the wafer W thereon by an electrostatic force such as Coulomb's force generated by a direct-current voltage from the direct-current power source 22. Thus, the electrostatic chuck ESC can hold the wafer W thereon.

A focus ring FR is disposed on a periphery of the second plate 18b so as to surround the edge of the wafer W and the electrostatic chuck ESC. The focus ring FR is provided to improve uniformity of etching. The focus ring FR is formed of a material selected depending on a material of the etching target film, and is formed of, for example, silicon and quartz.

The second plate 18b contains thereinside a refrigerant flow passage 24 that serves as a temperature adjustment mechanism. A refrigerant is supplied into the refrigerant flow passage 24 from a chiller unit provided outside the process chamber 12 through a pipe 26a, and the refrigerant supplied into the refrigerant flow passage 24 returns to the chiller unit via a pipe 26b. Thus, the refrigerant is supplied into the refrigerant flow passage 24 so that the refrigerant circulates through the refrigerant flow passage 24. Moreover, by adjusting a temperature of the refrigerant supplied into the refrigerant flow passage 24, the temperature of the wafer W held by the electrostatic chuck ESC is controlled.

The plasma processing apparatus 10 contains a gas supply line 28. The gas supply line 28 supplies a heat transfer gas such as helium (He) from a heat transfer gas supply mechanism to a location between the upper surface of the electrostatic chuck ESC and the back surface of the wafer W.

The plasma processing apparatus 10 includes an upper electrode 30. The upper electrode 30 is arranged above the pedestal PD so as to face the pedestal PD. The lower electrode LE and the upper electrode 30 are provided approximately parallel with each other. A process space A is formed between the upper electrode 30 and the lower electrode LE to process the wafer W with plasma.

The upper electrode 30 is supported at an upper portion of the process chamber 12 via an insulating shield member 32. The upper electrode 30 is, for example, configured to be able to change a distance G from the upper surface of the pedestal PD in the vertical direction. The upper electrode 30 includes an electrode plate 34 and an electrode support 36. The electrode plate 34 faces the process space A and has a plurality of gas discharge holes 34a. The electrode plate 34 is made of, for example, silicon. The electrode plate 34 illustrated in FIG. 1 has a flat plate shape, but may have an inverse tapered shape in which the distance G from the upper surface of the pedestal PD decreases with the increasing distance from the center of the electrode plate 34.

The electrode support 36 detachably supports the electrode plate 34, and is made of a conductive material such as aluminum. The electrode support 36 may have a water cooling structure. The electrode support 36 contains a gas diffusion chamber 36a thereinside. A plurality of gas flowing holes 36b in communication with the gas discharge holes 34a extends downward from the gas diffusion chamber 36a. Moreover, a gas introduction hole 36c is formed in the electrode support 36 to introduce a process gas into the gas diffusion chamber 36a, and a gas supply pipe 38 is connected to the gas introduction hole 36c.

A process gas supply source group 41 is connected to the gas supply pipe 38 via a valve group 42 and a flow rate controller group 43. Thus, a process gas can be supplied to the process space A. The process gas supply group 41 includes a supply source of a reaction gas such as a supply source of an oxygen-containing gas and a supply source of a nitrogen-containing gas, and a supply source of an etching gas. The oxygen-containing gas is, for example, oxygen ($O_2$) gas, ozone ($O_3$) gas, carbon monoxide gas, or carbon dioxide gas. The nitrogen-containing gas is, for example, nitrogen ($N_2$) gas or ammonia ($NH_3$) gas. The etching gas is a fluorocarbon gas such as $O_4F_6$ gas and $C_4F_8$ gas.

Moreover, a purge gas supply source is connected to the gas supply pipe 38. Thus, a purge gas can be supplied to the process space A. The purge gas is a noble gas or an inert gas such as N₂ gas. The noble gas is, for example, argon (Ar) gas, He gas, krypton (Kr) gas, or xenon (Xe) gas.

The valve group 42 includes a plurality of valves, and the flow rate controller group 43 includes a plurality of flow rate controllers such as mass flow controllers. Each of the plurality of gas supply sources included in the process gas supply source group 41 is connected to the gas supply pipe 38 via a corresponding valve of the valve group 42 and a corresponding flow rate controller of the flow rate controller group 43.

The gas discharge holes 34a, the gas diffusion chamber 36a, the gas flowing holes 36b, the gas introduction holes 36c, the gas supply pipes 38, the process gas supply source group 41, the valve group 42, the flow rate controller group 43, and the purge gas supply source constitute a first gas supply part 40.

The plasma processing apparatus 10 includes a deposition shield 46 detachably provided along the inner wall of the process chamber 12. The deposition shield 46 is also provided on the outer surface of the support 14. The deposition shield 46 is to prevent a by-product generated by etching from attaching to the process chamber 12, and is formed, for example, by coating aluminum with ceramics such as $Y_2O_3$.

A baffle plate 48 with many exhaust holes is provided around the pedestal PD to evacuate the process chamber 12 uniformly. The baffle plate 48 is formed by coating aluminum with ceramics such as $Y_2O_3$, and serves to shield a gas converted to plasma. An exhaust space B is formed below the baffle plate 48 so as to surround the pedestal PD. That is, the exhaust space B is in communication with the process space A through the baffle plate 48. The baffle plate 48 may be movable in the vertical direction at the location around the pedestal PD.

The process space A is connected to an evacuation device 50 including a vacuum pump such as a turbo molecular pump via an exhaust pipe 52. A gas in the process chamber 12 is discharged into the exhaust space B, and is evacuated via the exhaust pipe 52 by the evacuation device 50. Thus, the pressure in the process space A of the process chamber 12 can be reduced to a predetermined degree of vacuum. Because the conductance at a location where the baffle plate 48 is provided is low, the exhaust space B has a lower pressure than that of process space A at a predetermined diminution rate. The predetermined diminution rate depends on the number and sizes of exhaust holes and the like, and may be, for example, more than or equal to 30%.

A gas introduction hole 52a is formed in the exhaust pipe 52 to introduce a film deposition source (precursor) to the exhaust space B. The gas supply pipe 82 is connected to the gas introduction hole 52a.

A precursor gas supply source and a purge gas supply source (not illustrated in the drawings) are connected to the gas supply pipe 82 via a valve and a flow rate controller (not illustrated in the drawings). Thus, the precursor gas and/or the purge gas can be supplied to the exhaust space B from the gas supply pipe 82. The precursor gas is, for example, a silicon-containing gas. The silicon-containing gas is an aminosilane based gas such as BTBAS (bis(tertiary-butylamino)silane), BDEAS (bis(dimethylamino)silane), BDEAS (bis(diethylamino)silane), DMAS (di(methylamine)silane), DEAS (di(ethylamino)silane), DPAS (dipropylamino silane), BAS (butylamino silane), DIPAS (diisopropylamino silane), BEMAS (bis(ethylmethylamino)silane), a silicon alkoxide based gas such as TEOS (tetraethyl orthosilicate), and a halogenated silane gas such as $SiCl_4$ and $SiF_4$. The purge gas is a noble gas or N₂ gas. The noble gas is, for example, Ar gas, He gas, Kr gas or Xe gas.

The gas introduction hole 52a, the gas supply pipe 82, the precursor gas supply source, and the purge gas supply source constitute a second gas supply part 80.

A transfer opening 12g of the wafer W is provided in the side wall of the process chamber 12. The transfer opening 12g is openable/closeable by a gate valve 54.

Furthermore, the plasma processing apparatus 10 includes a first radio frequency power source 62 and a second radio frequency power source 64. The first radio frequency power source 62 is a power source to generate a first radio frequency power for plasma generation, and outputs radio frequency power in a range of 27 to 100 MHz, for example, of 40 MHz. The first radio frequency power source 62 is connected to the lower electrode LE via a matching box 66. The matching box 66 is a circuit to match output impedance of the first radio frequency power source 62 with input impedance on a load side (the lower electrode LE side). The first radio frequency power source 62 may be connected to the upper electrode 30 via the matching box 66.

The second radio frequency power source 64 is a power source to generate a second radio frequency power to attract ions to the wafer W, which is radio frequency bias power, and generates radio frequency bias power in a range of 400 kHz to 13.56 MHz, for example, of 13 MHz. The second radio frequency power source 64 is connected to the lower electrode LE via a matching box 68. The matching box 68 is a circuit to match output impedance of the second radio frequency power source 64 with input impedance on the load side (the lower electrode LE side).

The plasma processing apparatus 10 includes a power source 70. The power source 70 is connected to the upper electrode 30. The power source 70 applies a voltage to the upper electrode 30 to attract positive ions present in the process space A. The power source 70 is, for example, a direct-current power source that generates a negative direct-current voltage. The power source 70 may be an alternate-current power source that generates alternate-current power with a relatively low frequency. The voltage applied to the upper electrode from the power source 70 is, for example, a voltage higher than or equal to 150 V. When the voltage is applied to the upper electrode 30 from the power source 70, positive ions present in the process space A collide with the electrode plate 34. Thus, secondary electrons and/or silicon are discharged from the electrode plate 34. The discharged silicon binds with active species of fluorine present in the process space A, thereby reducing the amount of active species of fluorine.

The plasma processing apparatus 10 includes a controller 90. The controller 90 is a computer that includes a processor, a memory, an input device, a display device and the like, and controls each part of the plasma processing apparatus 10. An operator and the like can operate the controller 90 like inputting a command to manage the plasma processing apparatus 10 by using the input device. Moreover, the controller 90 can visualize and display an operational status of the plasma processing apparatus 10 by using the display device. Furthermore, the memory of the controller 90 stores a control program to cause the processor to control various processes executed by the plasma processing apparatus 10, and a program to cause each part of the plasma processing apparatus 10 to execute a process depending on process conditions, that is, a process recipe.

In the meantime, plasma processing apparatuses that can supply aminosilane based gas have the so-called post-mix structure, which is the structure of separating the supply pipe of the aminosilane gas from the supply pipe of the other process gas (e.g., oxygen gas). This is because the aminosilane based gas has high reaction properties and therefore when the aminosilane based gas and the other process gas are supplied into the same pipe, the aminosilane based gas adsorbed on the inside of the pipe reacts with the other process gas, thereby depositing a reaction product on the inside of the pipe. Moreover, the reaction product deposited inside the pipe is difficult to be removed by cleaning. Furthermore, when a location of the pipe is close to a plasma region, an abnormal discharge may be caused.

However, even in the plasma processing apparatus having the post-mix structure, when supplying the aminosilane based gas without supplying the other process gas, the aminosilane gas is liable to flow into the other process gas supply pipe. Therefore, to prevent the aminosilane gas from flowing into the other process gas supply pipe, an inert gas is supplied into the other process gas supply pipe when the other process gas is not supplied.

In addition, even in the plasma processing apparatus having the post-mix structure, when supplying the other process gases without supplying the aminosilane based gas, the other process gas is liable to flow into the aminosilane based gas supply pipe. Therefore, to prevent the other gas from flowing into the aminosilane based gas supply pipe, an inert gas is supplied into the aminosilane gas supply pipe when the aminosilane gas is not supplied.

However, when performing the film deposition process by ALD and the etching process by using the same plasma processing apparatus, the inert gas supplied to the plasma region through the aminosilane based gas supply pipe sometimes acts as an additive gas. When the inert gas serves as the additive gas in the etching process, sometimes, preferable etching shapes cannot be obtained due to a decrease in mask selectivity and an increase in Line Edge Roughness (LER).

The plasma processing apparatus 10 according to the embodiment of the present invention includes the second gas supply part 80 capable of supplying a precursor gas to the exhaust space B in communication with the process space A to which the process gas converted to plasma is supplied via the baffle plate 48. Thus, because the process gas converted to the plasma to be supplied to the process space A is shielded by the baffle plate 48, the process gas converted to the plasma is scarcely supplied to the exhaust space B and scarcely reaches the gas supply pipe 82 of the second gas supply part 80. This can prevent the precursor gas and the process gas converted to the plasma from reacting with each other and thereby from producing a reaction product in the gas supply pipe 82.

Moreover, because the plasma processing apparatus 10 according to the embodiment of the present invention includes the second gas supply pipe 80 in the exhaust space B, even if the purge gas is supplied when the second gas supply part 80 does not supply the precursor gas, the purge gas hardly reaches the process space A. This prevents the purge gas from acting as the additive gas in the etching process, thereby preventing a decrease in mask selectivity and an increase in LER, and makes it possible to acquire a preferable etching shape.

(Operation of Plasma Processing Apparatus)

Figure 2:
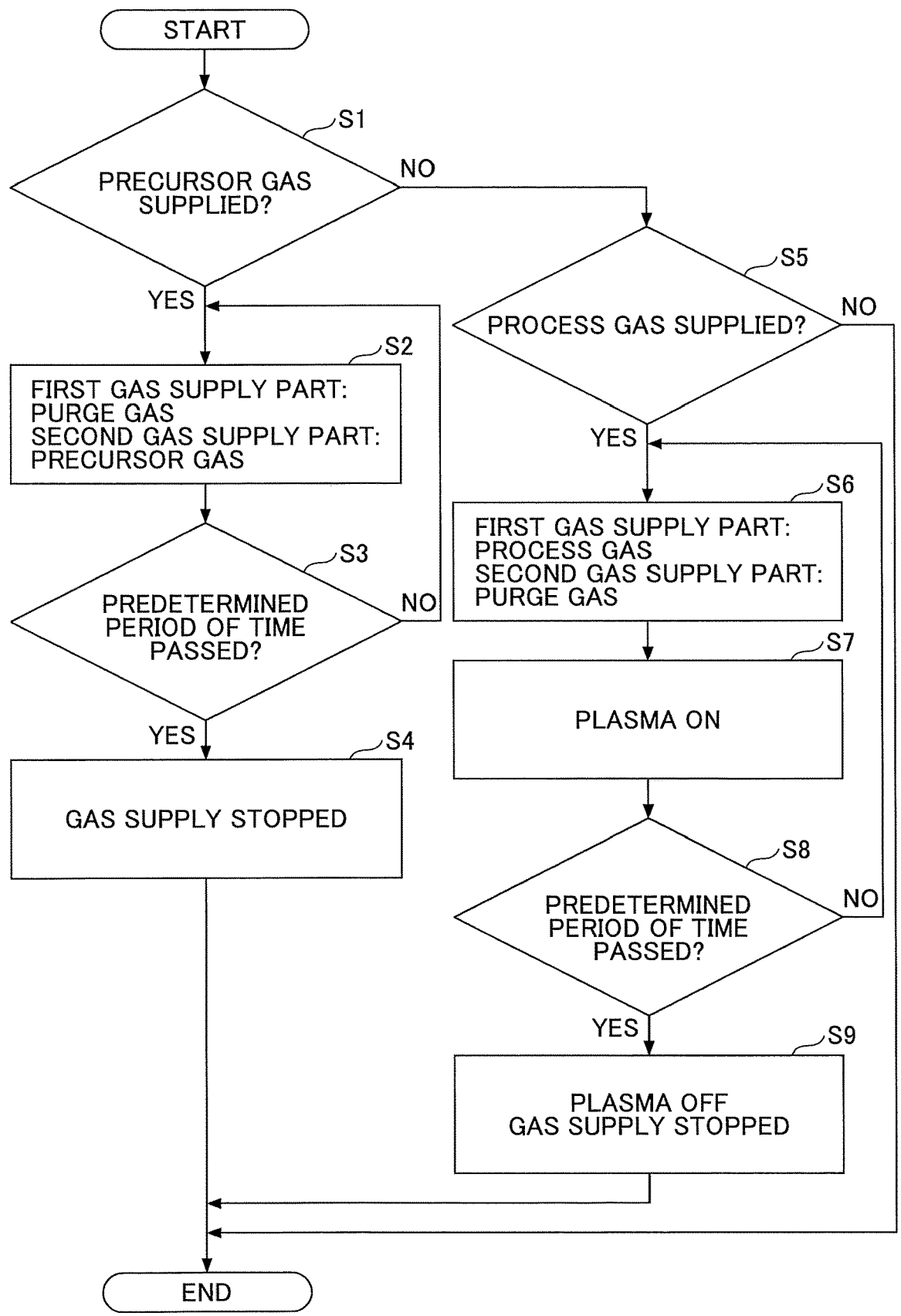
FIG. 2 is a flowchart for describing operation of the plasma processing apparatus in FIG. 1.

Next, the operation of the plasma processing apparatus 10 according to an embodiment of the present invention is described below. FIG. 2 is a flowchart for describing the operation of the plasma processing apparatus 10 in FIG. 1.

To begin with, when an operator or the like inputs a command to execute a predetermined plasma process to the plasma processing apparatus 10, the controller 90 determines whether or not the predetermined plasma process to be executed is a process of supplying a precursor gas (step S1).

In step S1, when the controller 90 determines that the process to be executed is the process of supplying the precursor, the controller 90 controls the plasma processing apparatus 10 such that the first gas supply part 40 supplies a purge gas to the process space A and that the second gas supply part 80 supplies the precursor gas to the exhaust space B (step S2). At this time, at least one of the purge gas flow rate and the distance G between the pedestal PD and the upper electrode 30 is preferably adjusted so that gas diffusion rather than a gas flow dominates gas transportation in the space from the first gas supply part 40 to the second gas supply part 80. More specifically, the purge gas flow rate is likely to be decreased, and the distance G is likely to be longer. When the gas diffusion rather than the gas flow dominates the gas transportation, the precursor gas supplied to the exhaust space B is likely to reach the surface of the wafer W by the diffusion of gas molecules while flowing against the flow of the purge gas supplied to the process space A. This helps the precursor gas efficiently adsorbs on the surface of the wafer W. Here, the gas diffusion rather than the gas flow dominates the gas transportation in the space from the first gas supply part 40 to the second gas supply part 80 when Peclet number described later is smaller than one.

Subsequently, the controller 90 determines whether or not a predetermined period of time has passed (step S3). The predetermined period of time means a predetermined period of plasma processing time to be executed.

In step S3, when the controller 90 has determined that the predetermined period of time has passed, the controller 90 controls the plasma processing apparatus 10 such that the first gas supply part 40 and the second gas supply part 80 stop the supply of gases (step S4). After that, the process flow ends.

In step S3, when the controller 90 determines that the predetermined period of time does not pass, the process returns to step S2. More specifically, the controller 90 controls the plasma processing apparatus 10 such that the first gas supply part 40 supplies the purge gas to the process space A and that the second gas supply part 80 supplies the precursor gas to the exhaust space B, until the predetermined period time passes.

In step S1, when the controller 90 determines that the process to be executed is not the process of supplying the precursor gas, the controller 90 determines whether the predetermined plasma process to be executed is a process of supplying a process gas (step S5).

In step S5, when the controller 90 determines that the process to be executed is the process of supplying the process gas, the controller 90 controls the plasma processing apparatus 10 such that the first gas supply part 40 supplies the process gas and that the second gas supply part 80 supplies the purge gas (step S6). At this time, at least one of the process gas flow rate supplied to the process space A and the distance G between the pedestal PD and the upper electrode 30 is preferably adjusted so that a gas flow rather than gas diffusion dominates gas transportation in the space from the first gas supply part 40 to the second gas supply part 80. More specifically, the process gas flow rate is likely to be increased, and the distance G is likely to be shorter. When the gas flow rather than gas diffusion dominates the gas transportation in the space from the first gas supply part 40 to the second gas supply part 80, the purge gas supplied to the exhaust space B cannot flow against the flow of process gas, and hardly reaches the surface of the wafer W. Thus, when a process that uses the process gas, for example, a plasma etching that uses an etching gas is performed, the purge gas supplied to the exhaust space B is prevented from acting as the additive gas. As a result, a preferable etching shape can be acquired without a decrease in mask selectivity and an increase in LER. Here, in step S5, the second gas supply part 80 does not have to supply the purge gas.

Next, the controller 90 controls the plasma processing apparatus 10 such that plasma turns on (step S7). More specifically, the controller 90 controls the operation of the first radio frequency power source 62 and the second radio frequency power source 64 so as to supply radio frequency power to the lower electrode LE, thereby generating plasma of the process gas in the process space A of the process chamber 12.

Subsequently, the controller 90 determines whether or not a predetermined period of time has passed (step S8). The predetermined period of time means a predetermined period of plasma processing time to be executed.

In step S8, when the controller 90 has determined that the predetermined period of time has passed, the controller 90 controls the operation of the plasma processing apparatus 10 such that the plasma turns off and that supply of the gases to the process space A and the exhaust space B is stopped (step S9). After that, the process flow ends.

In step S8, when the controller 90 determines that the predetermined period of time does not pass, the process returns to step S6. More specifically, the controller 90 controls the plasma processing apparatus 10 such that the first gas supply part 40 supplies the process gas to the process space A and that the second gas supply part 80 supplies the purge gas to the exhaust space B, until the predetermined period time passes.

Here, in step S5, whether controller 90 determines that the process to be executed is not a process of supplying the process gas, the process flow ends.

(Peclet Number)

Figure 3:
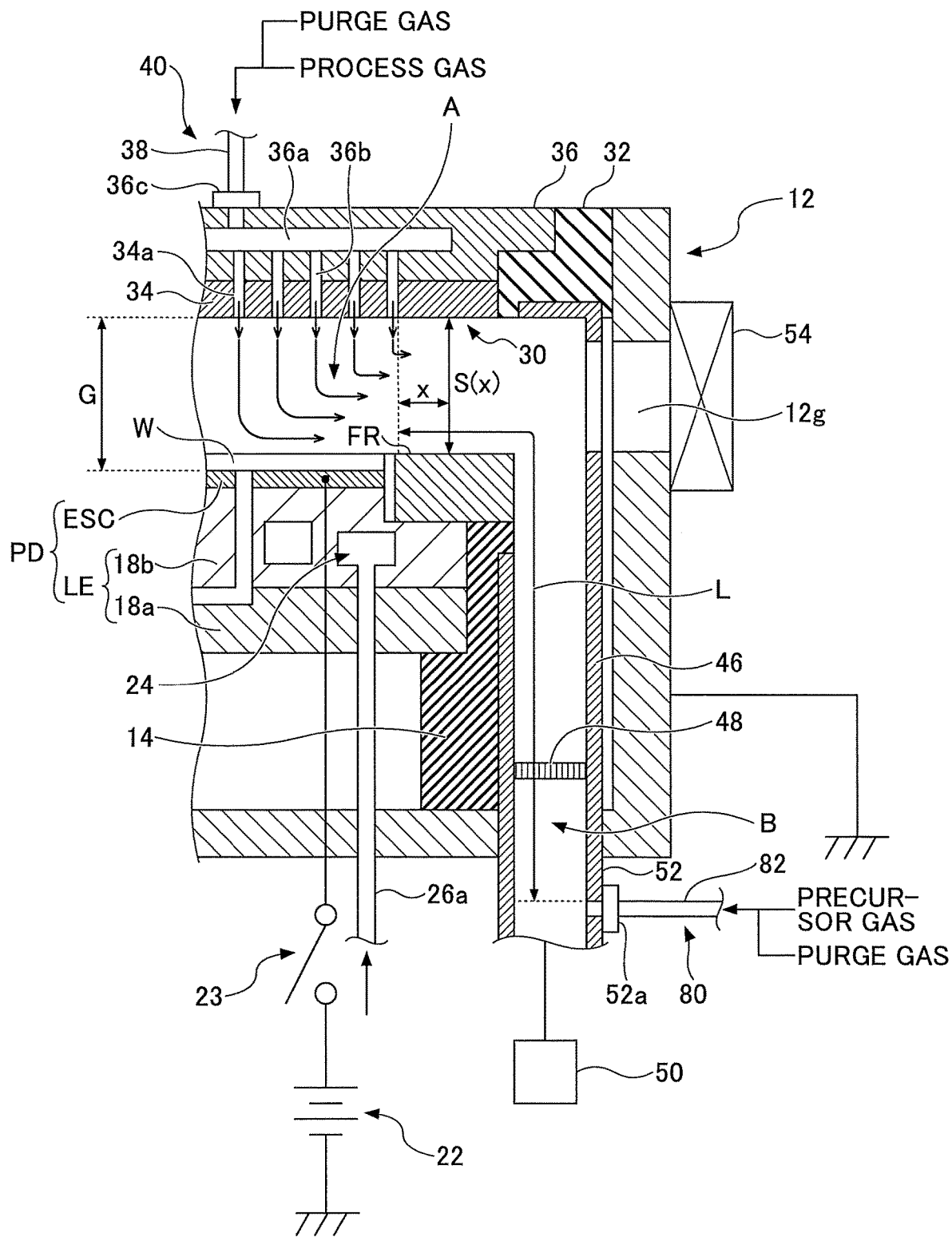
FIG. 3 is a partial cross-sectional view illustrating a configuration of a major part of the plasma processing apparatus in FIG. 1.

Next, Peclet number is described below. FIG. 3 is a partial cross-sectional view illustrating a configuration of a major part of the plasma processing apparatus 10 in FIG. 1.

As illustrated in FIG. 3, when the plurality of gas discharge holes 34a supplies a gas to the process space A that is a space between the upper electrode 30 and the pedestal PD, the gas flows toward the exhaust direction that is a direction that the evacuation device 50 is connected to, while diffusing. Whether a concentration distribution of gas components (e.g., radicals) transported by diffusion and a flow relies on either factors of the diffusion or the flow varies depending on an apparatus configuration, process conditions and the like. Peclet number Pe is known as a dimensionless number that characteristically shows which and how much factors of the diffusion and the flow the gas transportation relies on.

The Peclet number Pe is calculated from the following formula (1) by using a distance L (m) from an end of the first gas supply part 40 to the second gas supply part 80, a space cross-sectional area S that is perpendicular to a flow of a gas supplied from the first gas supply part 40, a gas supply flow rate Q (Torr m³/s) supplied from the first gas supply part 40, a pressure P (Torr) in the process chamber 12, a diffusion coefficient D (m²/s) of a gas supplied from the second gas supply part 80 relative to the gas supplied from the first gas supply part 40:

$$Pe = \frac{Q}{D \cdot P} \int_0^L \frac{1}{S_{(x)}} dx \quad (1)$$

The number one is set as a border of the Peclet number Pe, and the diffusion dominates the gas transportation when the Pe is smaller than one, and the flow dominates the gas transportation when the Pe is greater than one.

(Plasma Processing Method)

Subsequently, a plasma processing method according to an embodiment of the present invention is described below. The plasma processing method according to the embodiment of the present invention includes a film deposition process and an etching process. The film deposition process includes an adsorption process and a reaction process. The adsorption process is a process of adsorbing a precursor gas on a surface of a wafer W by supplying the precursor gas to the exhaust space B and supplying an inert gas to the process space A. The reaction process is a process of producing a reaction product of the precursor gas and a reaction gas by supplying the reaction gas that reacts with the precursor gas. The etching process is a process of performing etching by supplying an etching gas to the process space A. When switching between the processes, a purge process of exchanging the precursor gas, the reaction gas, and the etching gas remaining in the process space A for the purge gas may be performed by supplying the purge gas to the process space A.

The plasma processing method is described below by citing an example of performing film deposition of a silicon oxide film by ALD and plasma etching by using the above-mentioned plasma processing apparatus 10. More specifically, to begin with, a wafer W on which an etching target film and a resist pattern are formed is prepared. Next, a silicon oxide film is deposited on the resist pattern to cover a surface of the resist pattern by ALD. Subsequently, a desired fine pattern is formed by etching the etching target film by the plasma etching. Here, the plasma processing method is performed by causing the controller 90 to control operation of each part of the plasma processing apparatus 10.

Figure 4:
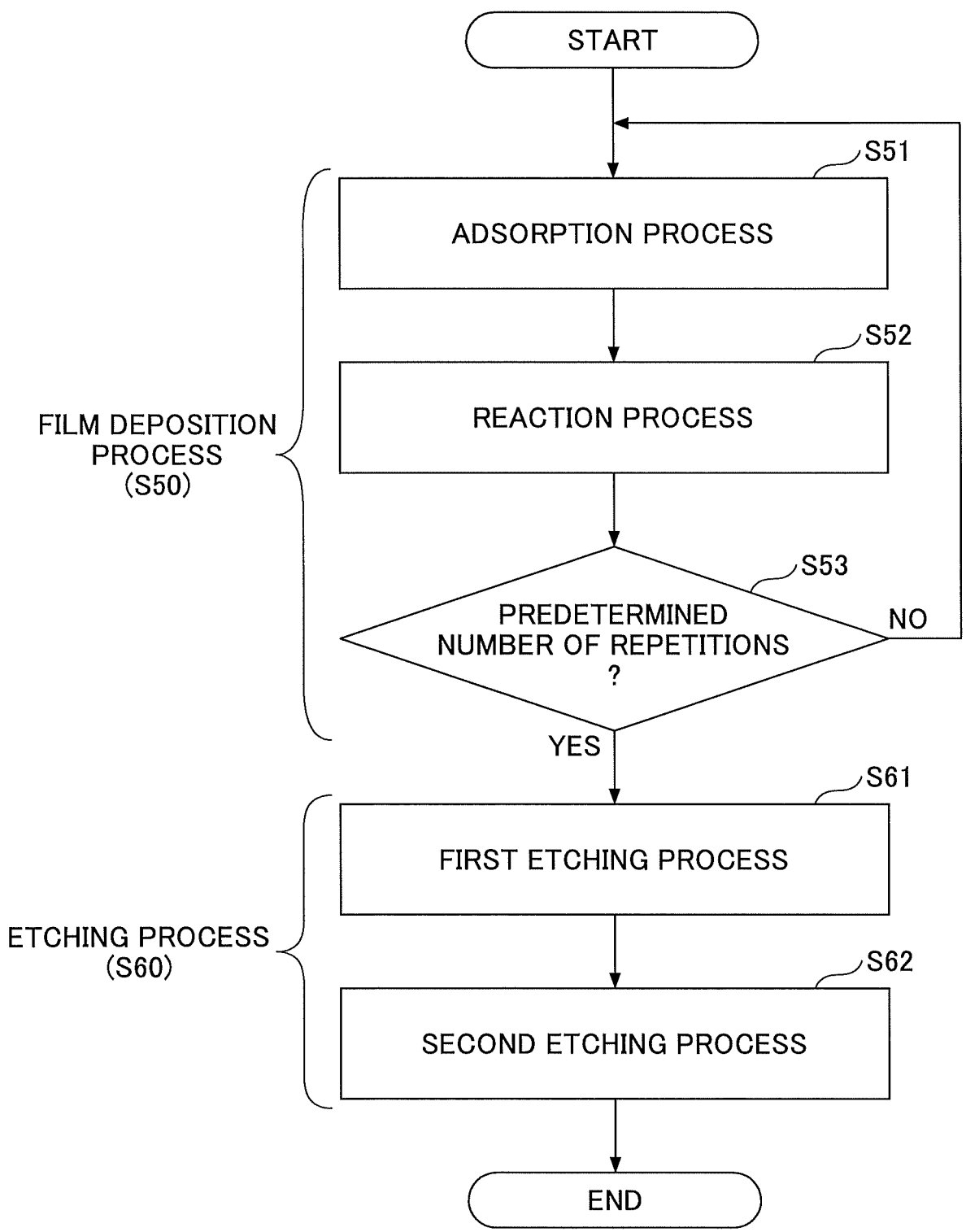
FIG. 4 is a flowchart for describing a plasma processing method according to an embodiment of the present invention.

FIG. 4 is a flowchart to describe the plasma processing method according to the embodiment of the present invention. As illustrated in FIG. 4, the plasma processing method according to the embodiment of the present invention includes the film deposition process (step S50) of depositing the silicon oxide film by ALD and the etching process (step S60) of performing the plasma etching.

The film deposition process (step S50) includes an adsorption process (step S51), a reaction process (step S52) and a determination process (step S53).

The adsorption process (step S51) is a process of adsorbing an aminosilane gas on the resist pattern by supplying the aminosilane gas. In the adsorption process (step S51), the aminosilane gas is supplied from the second gas supply part 80 to the exhaust space B, and an inert gas is supplied from the first gas supply part 40 to the process area A. At this time, the flow rate of the inert gas is preferably adjusted so that gas diffusion rather than a gas flow dominates gas transportation in the space from the first gas supply part 40 to the second gas supply part 80. When the gas diffusion rather than the gas flow dominates the gas transportation in the space from the first gas supply part 40 to the second gas supply part 80, the aminosilane gas supplied to the exhaust space B flows against the flow of the inert gas supplied to the process space A and is likely to reach the surface of the wafer W by the diffusion of gas molecules. Thus, the aminosilane gas efficiently adsorbs on the resist pattern.

The reaction process (step S52) is a process of depositing the silicon oxide film by supplying oxygen gas converted to plasma and causing oxygen gas converted to the plasma to react with the aminosilane gas adsorbed on the resist pattern. In the reaction process (step S52), oxygen gas is supplied from the first gas supply part 40 to the process space A, and an inert gas is supplied from the second gas supply part 80 to the exhaust space B. Moreover, the first radio frequency power source 62 supplies a first frequency power to the lower electrode LE, thereby converting supplied oxygen gas to plasma. The baffle plate 48 to shield oxygen gas converted to the plasma is provided between the process space A and the exhaust space B. Because the baffle plate 48 blocks oxygen gas converted to the plasma, oxygen gas converted to the plasma is hardly supplied to the exhaust space B and hardly reaches the gas supply pipe 82 of the second gas supply part 80. This can inhibit the precursor gas and oxygen gas converted to the plasma from reacting with each other to produce a reaction product in the gas supply pipe 82. Also, because attracting ions from the plasma is unnecessary, the second radio frequency power source 64 does not preferably supply the second radio frequency power to the lower electrode LE.

The determination process (step S53) is a process of determining whether the adsorption process and the reaction process are repeated more than a predetermined number of repetitions from starting the film deposition. In the determination process (step S53), when the controller 90 determines that the adsorption process and the reaction process are repeated more than the predetermined number of repetitions, the film deposition process (step S50) ends, and an etching process (step S60) is performed. In the determination process (step S53), when the controller 90 determines that the adsorption process and the reaction process are not repeated more than the predetermined number of repetitions, the process returns to the adsorption process (step S51), and the adsorption process (step S51) and the reaction process (step S52) are performed. The number of repetitions is preliminarily determined depending on a film thickness of a film to be deposited and the like.

Thus, in the film deposition process (step S50), by repeating the adsorption process (step S51) and the reaction process (step S52) until exceeding the preliminarily determined number of repetitions, a silicon oxide film of a desired film thickness is deposited.

The etching process (step S60) includes a first etching process (step S61) and a second etching process (step S62).

The first etching process (step S61) is a process of removing the silicon oxide film formed on the upper surface of the resist pattern by supplying a first etching gas to leave the silicon oxide film on the side walls of the resist pattern. In the first etching process (step S61), the first etching gas is supplied to the process space A from the first gas supply part 40, and an inert gas is supplied to the exhaust space B from the second gas supply part 80. An etching gas that etches the silicon oxide film more than the resist pattern can be used as the first etching gas, and a fluorocarbon gas such as $CF_4$ and $C_4F_8$ and a hydrofluorocarbon gas such as $CHF_3$ and $CH_2F_2$ are cited as examples of the etching gas. Moreover, the first radio frequency power source 62 supplies the first radio frequency power to the lower electrode LE, and the second radio frequency power source 64 supplies the second radio frequency power to the lower electrode LE. The silicon oxide film remaining on the side walls of the resist pattern plays a role of preventing the width of the resist pattern from narrowing in the second etching process (step S62). This is because the silicon oxide film remaining on the side walls of the resist pattern can prevent atoms and plasma ions from colliding with the side walls of the resist pattern.

In the first etching process (step S61), at least one of the flow rate of the first etching gas supplied to the process space A and the distance G between the pedestal PD and the upper electrode 30 is preferably adjusted so that a gas flow rather than gas diffusion dominates gas transportation in the space from the first gas supply part 40 to the second gas supply part 80. More specifically, the first etching gas flow rate is likely to be increased, and the distance G is likely to be shorter. When the gas flow rather than gas diffusion dominates the gas transportation in the space from the first gas supply part 40 to the second gas supply part 80, the inert gas supplied to the exhaust space B cannot flow against the flow of first etching gas, and hardly reaches the surface of the wafer W due to diffusion of gas molecules. Thus, the inert gas supplied to the exhaust space B is prevented from acting as the additive gas to the first etching gas. As a result, a preferable etching shape can be acquired without a decrease in mask selectivity and an increase in LER.

The second etching process (step S62) is a process of forming a pattern of an etching target film by supplying a second etching gas and etching the etching target film by using the resist pattern as an etching mask. In the second etching process (step S62), the second etching gas is supplied to the process space A from the first gas supply part 40, and an inert gas is supplied the exhaust space B from the second gas supply part 80. An etching gas that etches the resist pattern more than the silicon oxide film can be used as the second etching gas, and $O_2$ and $H_2/N_2$ are cited as examples of the etching gas. Thus, because the etching rate of the resist pattern increases whereas the etching rate of the silicon oxide film decreases when etching the etching target film, the resist pattern is damaged. When the resist pattern is damaged, a polymer of an organic substance is produced as a result of reaction of a resist material with the etching gas. For example, such a polymer can be a substance containing carbon and fluorine. When the polymer is produced, a polymer film is formed on the top of the resist pattern. The polymer film prevents the resist pattern thereunder from being further damaged.

In the second etching process (step S62), at least one of the flow rate of the second etching gas supplied to the process space A and the distance G between the pedestal PD and the upper electrode 30 is preferably adjusted so that a gas flow rather than gas diffusion dominates gas transportation in the space from the first gas supply part 40 to the second gas supply part 80. More specifically, the second etching flow rate is likely to be increased, and the distance G is likely to be shorter. When the gas flow rather than gas diffusion dominates the gas transportation in the space from the first gas supply part 40 to the second gas supply part 80, the inert gas supplied to the exhaust space B cannot flow against the flow of second etching gas, and hardly reaches the surface of the wafer W due to diffusion of gas molecules. Thus, the inert gas supplied to the exhaust space B is prevented from acting as the additive gas to the second etching gas. As a result, a preferable etching shape can be acquired without a decrease in mask selectivity and an increase in LER.

WORKING EXAMPLES

Working examples performed to confirm etching characteristics and film deposition characteristics in the plasma processing method using the plasma processing apparatus according to the embodiments of the present invention are described below.

Working Example 1

In a working example 1, a silicon-containing antireflection coating (SiARC) that was an etching target film was etched with plasma in the following etching conditions.
(Etching Conditions)
First Gas Supply Part: $O_2/CF_4$=5 sccm/55 sccm
Second Gas Supply Part: Ar=200 sccm
First Radio Frequency Power Source: 400 W, Continuous Wave
Second Radio Frequency Power Source: 50 W, Continuous Wave To compare with the working example 1, a plasma etching of a comparative example 1 was performed on a SiARC under the same etching conditions as those of the working example 1 except that the space to which Ar gas, which was a purge gas, was supplied, was made the process space A instead of the exhaust space B. Also, a plasma etching of a reference example 1 was performed on a SiARC under the same conditions as those of the working example 1 except that Ar gas, which was a purge gas, was not supplied.

Comparative Example 1

In the comparative example 1, the plasma etching was performed on the SiARC that was the etching target film in the following etching conditions.
(Etching Conditions)
First Gas Supply Part: $O_2/CF_4$=5 sccm/55 sccm
Second Gas Supply Part: No gas was supplied (Ar=0 sccm)
Gas supply Part that Can Supply Gas to Process Space A: Ar=200 sccm
First Radio Frequency Power Source: 400 W, Continuous Wave
Second Radio Frequency Power Source: 50 W, Continuous Wave Reference Example 1

Figure 5:
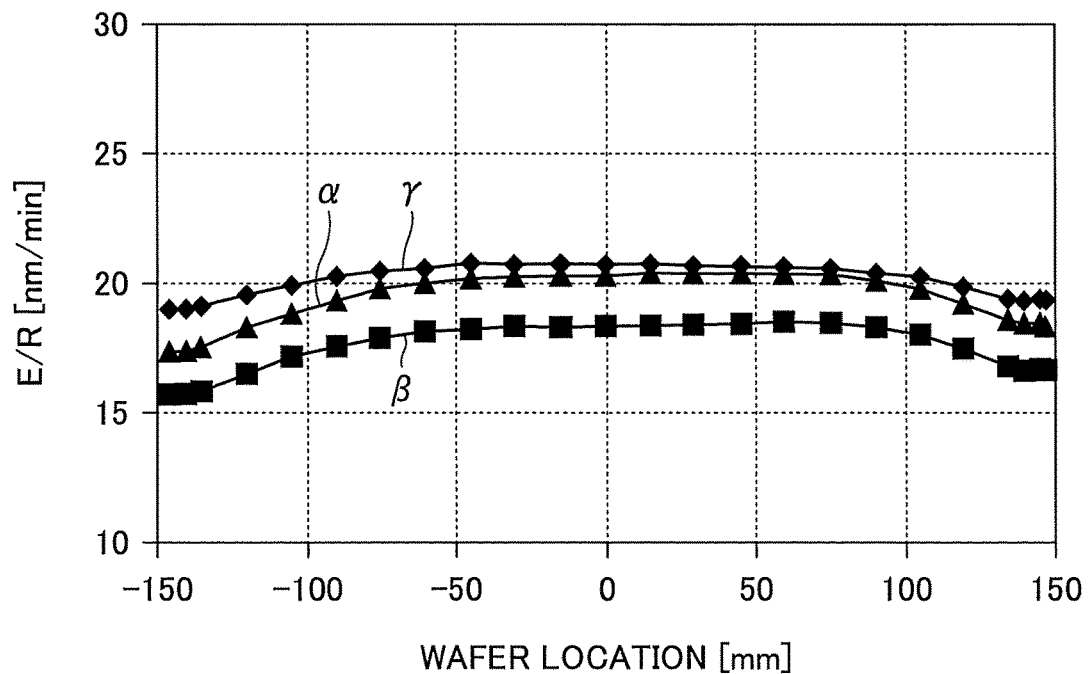
FIG. 5 is a graph showing an etching rate of a silicon-containing antireflection coating (SiArc) according to an embodiment of the present invention.

In the reference example 1, the plasma etching was performed on the SiARC that was the etching target film in the following etching conditions.
(Etching Conditions)
First Gas Supply Part: $O_2/CF_4$=5 sccm/55 sccm Second Gas Supply Part: No gas was supplied (Ar=0 sccm)
First Radio Frequency Power Source: 400 W, Continuous Wave
Second Radio Frequency Power Source: 50 W, Continuous Wave FIG. 5 is a graph showing an etching rate of the SiARC. In FIG. 5, the horizontal axis shows a position of a wafer in a diameter direction (mm), and 0 (mm) is the center of the wafer. The vertical axis shows an etching rate (nm/min). FIG. 5 shows an etching rate of the working example 1 by a characteristic line α, an etching rage of the comparative example by a characteristic line β, and an etching rate of the reference example 1 by a characteristic line γ.

As shown in FIG. 5, Ar gas that was the purge gas was supplied to the exhaust space B from the second gas supply part 80 (characteristic line α), the etching rate was 19.3 nm/min±8.3%. On the other hand, when Ar gas that is the purge gas was supplied to the process space A (characteristic line β), the etching rate was 17.4 nm/min±8.4%. Moreover, when Ar gas that was the purge gas was not supplied (characteristic line γ), the etching rate was 20.1 nm/min±4.9%.

That is, by supplying Ar gas that was the purge gas to the exhaust space B from the second gas supply part 80, the etching rate approximately the same degree as that in the case of not supplying Ar gas that was the purge gas, could be obtained. In contrast, when Ar gas that was the purge gas was supplied to the process space A, the etching rate significantly decreased in comparison to the case of not supplying Ar that was the purge gas.

Thus, in the working example 1, the etching rate approximately the same level as that of the reference example 1 could be obtained. From the result, the working example 1 is considered to be able to acquire approximately the same etching characteristics as that of the reference example 1.

Working Example 2

In a working example 2, a plasma etching was performed on a spin-on carbon (SOC) film that was an etching target film in the following etching conditions.
(Etching Conditions)
First Gas Supply Part: $H_2/N_2$=350 sccm/350 sccm
Second Gas Supply Part: Ar=200 sccm
First Radio Frequency Power Source: 500 W, Continuous Wave
Second Radio Frequency Power Source: 100 W, Continuous Wave To compare with the working example 2, a plasma etching of a comparative example 2 was performed on a SOC film under the same etching conditions as those of the working example 2 except that the space to which Ar gas, which was a purge gas, was supplied, was made the process space A instead of the exhaust space B. Also, a plasma etching of a reference example 2 was performed on a SOC film under the same conditions as those of the working example 2 except that Ar gas, which was a purge gas, was not supplied.

Comparative Example 2

In the comparative example 2, the plasma etching was performed on the SOC film that was the etching target film in the following etching conditions.
(Etching Conditions)
First Gas Supply Part: $H_2/N_2$=350 sccm/350 sccm
Second Gas Supply Part: No gas was supplied (Ar=0 sccm)
Gas supply Part that Can Supply Gas to Process Space A: Ar=200 sccm
First Radio Frequency Power Source: 500 W, Continuous Wave
Second Radio Frequency Power Source: 100 W, Continuous Wave Reference Example 2

Figure 6:
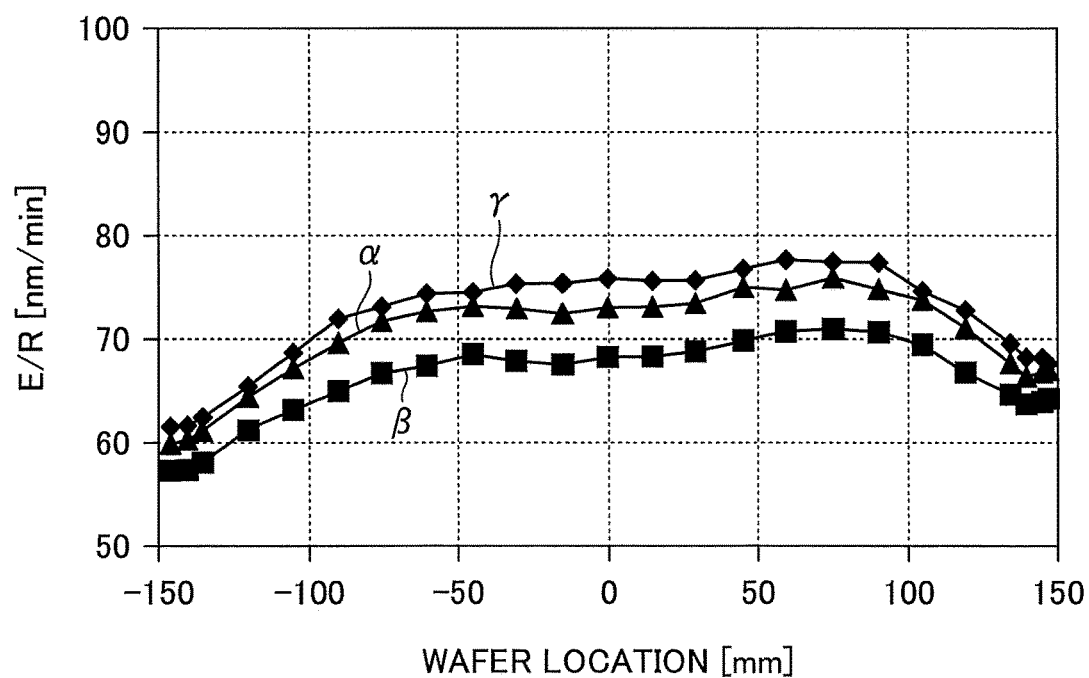
FIG. 6 is a graph showing an etching rate of a spin-on carbon (SOC) film according to an embodiment of the present invention.

In the reference example 2, the plasma etching was performed on the SOC film that was the etching target film in the following etching conditions.
(Etching Conditions)
First Gas Supply Part: $H_2/N_2$=350 sccm/350 sccm
Second Gas Supply Part: No gas was supplied (Ar=0 sccm)
First Radio Frequency Power Source: 500 W, Continuous Wave
Second Radio Frequency Power Source: 100 W, Continuous Wave FIG. 6 is a graph showing an etching rate of the SOC film. In FIG. 6, the horizontal axis shows a position of a wafer in a diameter direction (mm), and 0 (mm) is the center of the wafer. The vertical axis shows an etching rate (nm/min). FIG. 6 shows an etching rate of the working example 2 by a characteristic line α, an etching rage of the comparative example by a characteristic line β, and an etching rate of the reference example 2 by a characteristic line γ.

As shown in FIG. 6, Ar gas that was the purge gas was supplied to the exhaust space B from the second gas supply part 80 (characteristic line α), the etching rate was 69.4 nm/min±11.4%. On the other hand, when Ar gas that was the purge gas was supplied to the process space A (characteristic line β), the etching rate was 65.7 nm/min±10.5%. Moreover, when Ar gas that was the purge gas was not supplied (characteristic line γ), the etching rate was 71.2 nm/min±11.2%.

That is, by supplying Ar gas that was the purge gas to the exhaust space B from the second gas supply part 80, the etching rate approximately the same degree as that in the case of not supplying Ar gas that was the purge gas, could be obtained. In contrast, when Ar gas that was the purge gas was supplied to the process space A, the etching rate significantly decreased in comparison to the case of not supplying Ar that was the purge gas.

Thus, in the working example 2, because the etching rate approximately the same level as that of the reference example 2 could be obtained, the supply of Ar gas has a smaller effect on the etching characteristics than that in the comparative example 2.

Working Example 3

Figure 7:
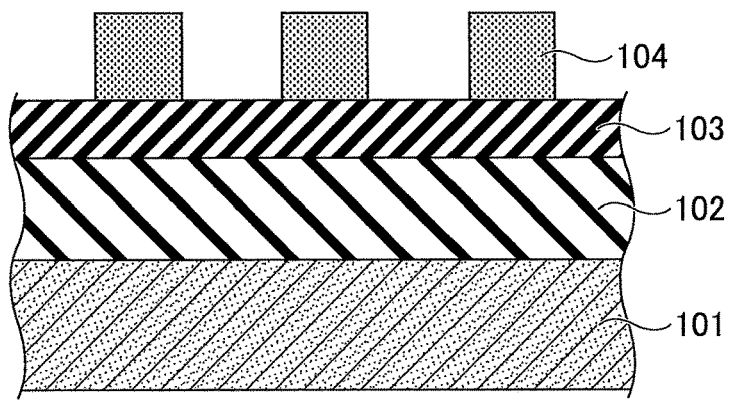
FIG. 7 is a diagram for describing an etching target film according to an embodiment of the present invention.

In a working example 3, to begin with, as illustrated in FIG. 7, a SiARC layer 103 and a resist pattern 104 were formed on an SOC film 102 that was an etching target film and is formed on a silicon wafer 101. Then, a plasma etching was performed on the SOC film 102 by using the resist pattern 104 as an etching mask in the following etching conditions.

(Etching Conditions)
First Gas Supply Part: $H_2/N_2$=350 sccm/350 sccm
Second Gas Supply Part: Ar=200 sccm
First Radio Frequency Power Source: 500 W, Continuous Wave
Second Radio Frequency Power Source: 100 W, Continuous Wave To compare with the working example 3, a plasma etching of a comparative example 3 was performed on the SOC film 102 under the same etching conditions as those of the working example 3 except that the space to which Ar gas, which was a purge gas, was supplied, was made the process space A instead of the exhaust space B.

Comparative Example 3

In the comparative example 3, the plasma etching was performed on the SOC film 102 that was the etching target film in the following etching conditions.

Figure 8A:
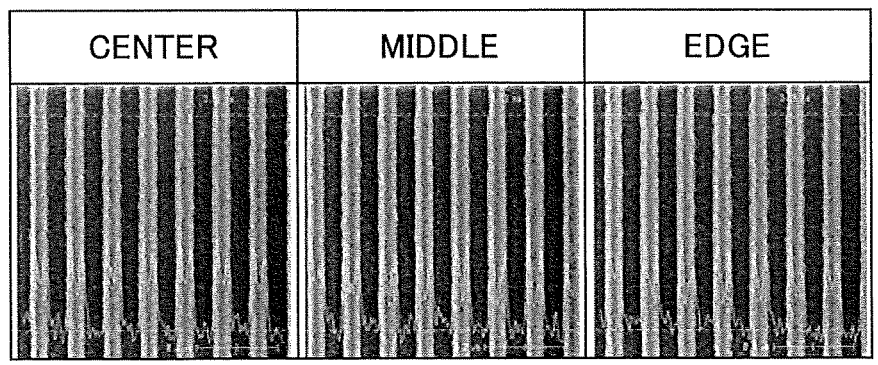
FIGS. 8A and 8B are diagrams showing an etching target film after plasma etching.
Figure 8B:
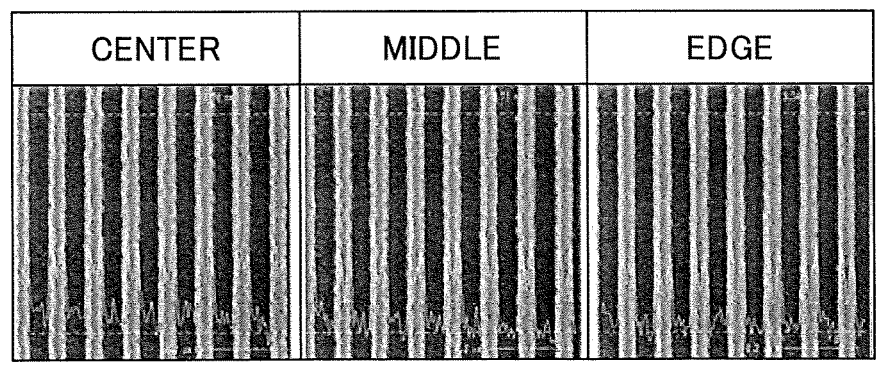

(Etching Conditions)
First Gas Supply Part: $H_2/N_2$=350 sccm/350 sccm
Second Gas Supply Part: No gas was supplied (Ar=0 sccm)
Gas supply Part that Can Supply Gas to Process Space A: Ar=200 sccm
First Radio Frequency Power Source: 500 W, Continuous Wave
Second Radio Frequency Power Source: 100 W, Continuous Wave FIGS. 8A and 8B are diagrams showing the etching target film after the plasma etching. FIG. 8A shows a result of supplying Ar gas to the exhaust space B (working example 3). FIG. 8B shows a result of supplying Ar gas to the process space A (comparative example 3). Moreover, in FIGS. 8A and 8B, the figure on the left side (CENTER) shows the etching target film in the central region of the wafer, and the figure on the right side (EDGE) shows the etching target film at the edge region of the wafer. The figure in the middle (MIDDLE) shows the etching target film in a region between the central region and the edge region.

As illustrated in FIGS. 8A and 8B, by supplying Ar gas to the exhaust space B from the second gas supply part 80 (working example 3), roughness of the pattern improved at any location of the wafer in comparison to the case of supplying Ar gas to the process space A (comparative example 3).

Figure 9A:
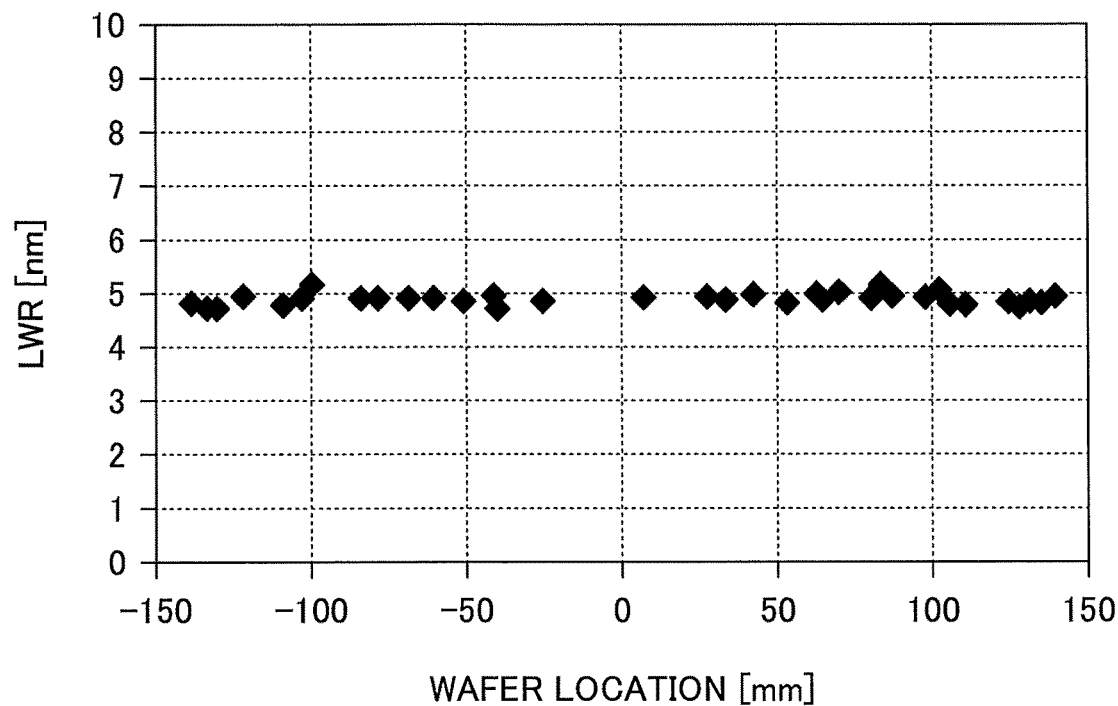
FIGS. 9A and 9B are graphs showing LWR of an etching target film after plasma etching.
Figure 9B:
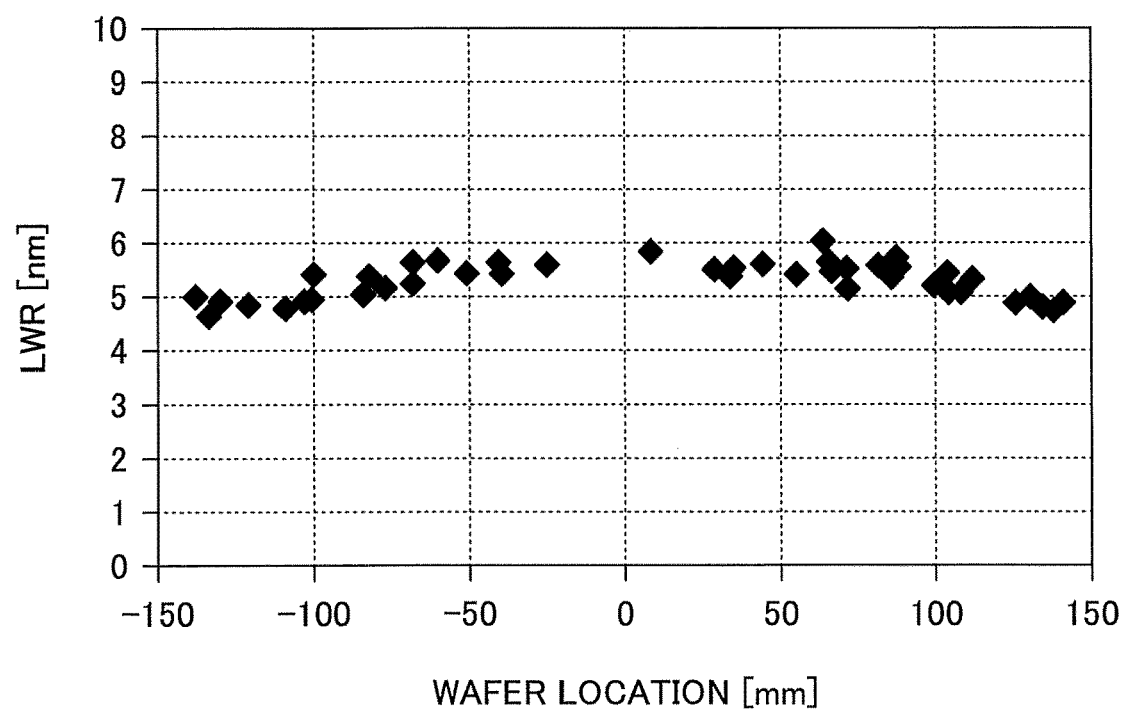

FIGS. 9A and 9B are graphs showing Line Width Roughness (LWR) of the etching target film after the plasma etching. FIG. 9A shows a result of the working example 3, and FIG. 9B shows a result of the comparative example 3. In FIGS. 9A and 9B, the horizontal axis shows a position of the wafer in a diameter direction (mm), and 0 (mm) shows the center of the wafer. The vertical axis shows LWR (nm).

As illustrated in FIG. 9A, in the working example 3, LWR was 4.9 nm±5.1%. In contrast, as shown in FIG. 9B, in the comparative example 3, LWR was 5.3 nm±13.0%. Thus, in the working example 3, LWR was able to be enhanced better that of comparative example 3.

Figure 10A:
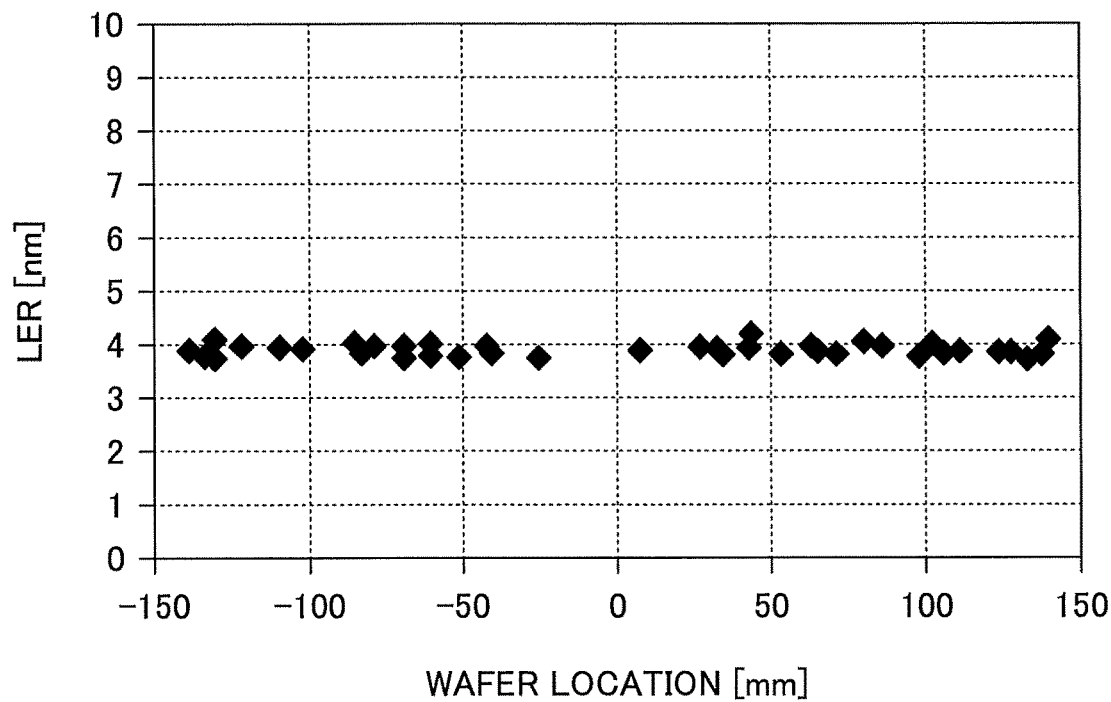
FIGS. 10A and 10B is graphs showing LER of an etching target film after plasma etching.
Figure 10B:
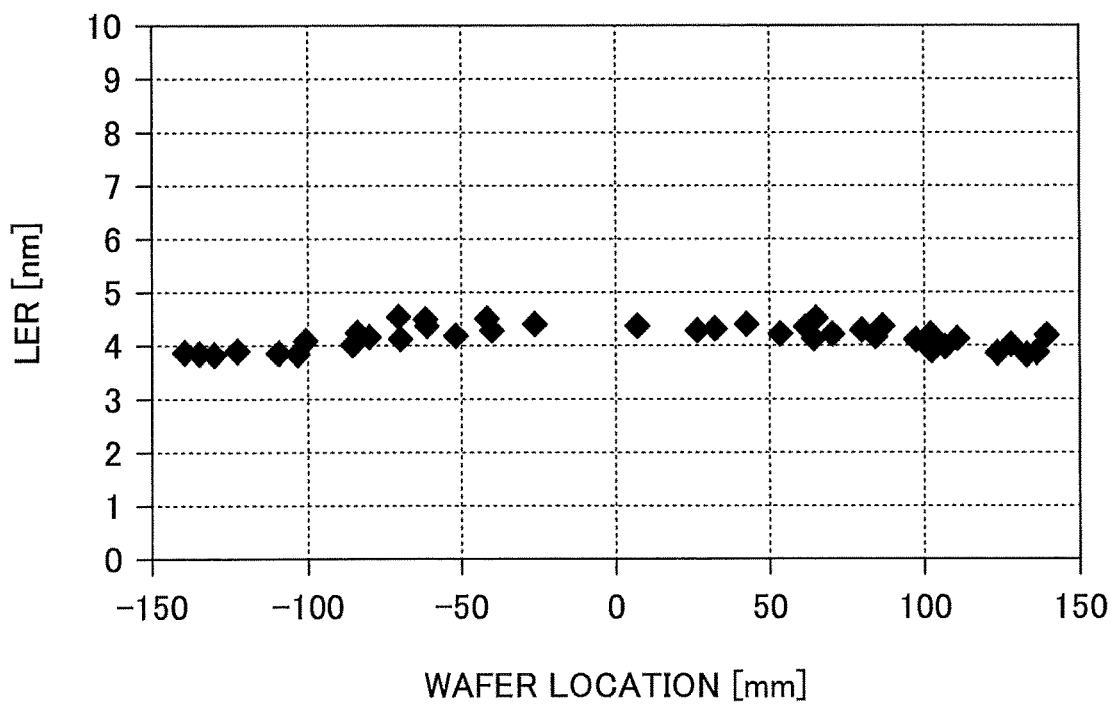

FIGS. 10A and 10B are graphs showing LER of the etching target film after the plasma etching. FIG. 10A shows a result of the working example 3, and FIG. 10B shows a result of the comparative example 3. In FIGS. 10A and 10B, the horizontal axis shows a position of the wafer in a diameter direction (mm), and 0 (mm) shows the center of the wafer. The vertical axis shows LER (nm).

As shown in FIG. 10A, in the working example 3, LER was 3.9 nm±5.6%. In contrast, as shown in FIG. 10B, in the comparative example 3, LER was 4.1 nm±8.5%. Thus, in the working example 3, LER was able to be enhanced better than that of the comparative example 3.

Working Example 4

In a working example 4, a silicon oxide film was deposited on a surface of a wafer by repeating the following adsorption process and reaction process.
(Adsorption Process)
First Gas Supply Part: $N_2$
Second Gas Supply Part: Aminosilane Gas
(Reaction Process)
First Gas Supply Part: $O_2$
Second Gas Supply Part: No gas was supplied
First Radio Frequency Power Source: 300 W, Continuous Wave
Second Radio Frequency Power Source: 0 W A silicon oxide film was deposited on a surface of a wafer as a reference example 4 under the same film deposition conditions as those of the working example 4 except that the space to which an aminosilane gas, which was a precursor gas, was supplied, was made the process space A instead of the exhaust space B.

Reference Example 4

In a reference example 4, a silicon oxide film was deposited on a surface of a wafer by repeating the following adsorption process and reaction process.

Figure 11:
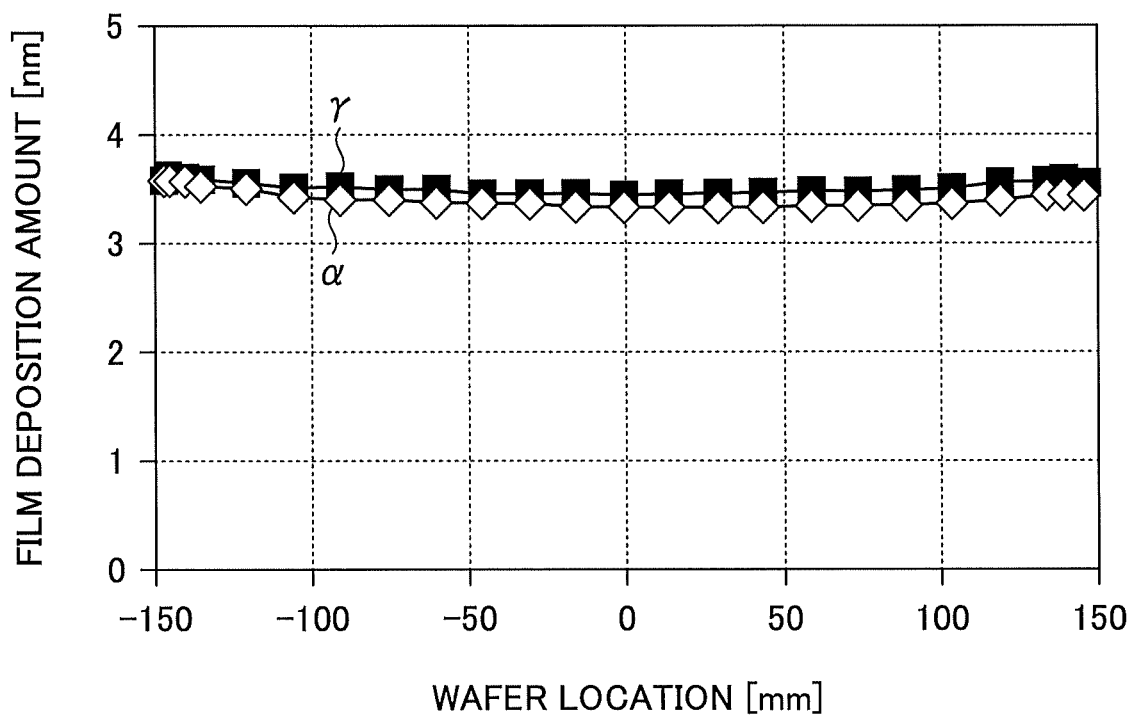
FIG. 11 is a graph showing an amount of film deposition of a silicon oxide film.

(Adsorption Process)
First Gas Supply Part: Aminosilane Gas
Second Gas Supply Part: No gas was supplied
(Reaction Process)
First Gas Supply Part: O₂
Second Gas Supply Part: No Gas Was Supplied
First Radio Frequency Power Source: 300 W, Continuous Wave
Second Radio Frequency Power Source: 0 W FIG. 11 is a graph showing an amount of film deposition of a silicon oxide film. In FIG. 11, the horizontal axis shows a position of a wafer in a diameter direction (mm), and 0 (mm) is the center of the wafer. The vertical axis shows the amount of film deposition (nm). FIG. 11 shows the amount of film deposition of the silicon oxide film deposited in the working example 4 by a characteristic line α, and the amount of film deposition of the silicon oxide film deposited in the reference example 4 by a characteristic line γ.

As shown in FIG. 11, the aminosilane gas that was the precursor gas was supplied to the exhaust space B from the second gas supply part 80 (characteristic line α), the amount of film deposition was 3.4 nm±3.6%. On the other hand, when the aminosilane gas that was the precursor gas was supplied to the process space A (characteristic line γ), the amount of film deposition was 3.5 nm±2.7%.

That is, by supplying the aminosilane gas that was the precursor gas to the exhaust space B from the second gas supply part 80, the amount of film deposition approximately the same as that in the case of supplying the aminosilane gas that was the precursor gas, could be obtained. From the result, even if the aminosilane gas that is the precursor gas to the exhaust space B, there seems to be little effects on the film deposition by ALD.

In the above embodiments, the baffle plate 48 is an example of a shielding part. The evacuation device 50 is an example of an evacuation part. The wafer W is an example of a substrate. The process gas is an example of a first gas, and the precursor gas is an example of a second gas.

As discussed above, according to the embodiments of the plasma processing apparatus, in the plasma processing apparatus having a post-mix structure, a preferable etching shape can be obtained.

Hereinabove, although the plasma processing apparatus and the plasma processing method have been described according to the embodiments, the plasma processing apparatus and the plasma processing method of the present invention is not limited to the embodiments, and various modifications and improvements can be made without departing from the scope of the invention. Moreover, the embodiments and modifications can be combined as long as they are not contradictory to each other.

In the above embodiments, an example of using the capacitively coupled plasma (CCP: Capacitively Coupled Plasma) apparatus was described as the plasma processing apparatus. However, a type of the plasma processing apparatus is not limited to this, the embodiments of the present invention can be applied to other types of plasma processing apparatuses such as an inductively coupled plasma (ICP: Inductively Coupled Plasma) apparatus and a microwave plasma processing apparatus.

In the above embodiments, although a single wafer type plasma processing apparatus that processes only a single wafer atone time is described as an example of the plasma processing apparatus, the embodiments of the present invention are not limited to this. For example, the embodiments of the present invention can be applied to a batch type plasma processing apparatus that processes a plurality of wafers together at one time.

In the above embodiments, an example of using a semiconductor wafer as a substrate is described, but the embodiments of the present invention are not limited to the example. For example, the embodiments of the present invention can be applied to other substrates such as a LCD (Liquid Crystal Display) glass substrate.

What is claimed is:
1. A plasma processing apparatus, comprising:
a process chamber;
a pedestal provided in the process chamber and configured to hold a substrate;
a first gas supply part configured to be able to supply a first gas from a location facing the pedestal;
a radio frequency power source configured to convert the first gas to plasma;
a shield part to block the first gas converted to plasma and provided around the pedestal;
an evacuation device configured to evacuate the process chamber through the shield part;
a second gas supply part configured to be able to supply a second gas to a space between the shield part and the evacuation device; and
a controller configured to control operation of the first gas supply part and the second gas supply part,
wherein the first gas supply part is configured to be able to supply a first purge gas,
wherein the controller configured to control the operation of the first gas supply part and the second gas supply part such that the first gas supply part supplies the first purge gas and that the second gas supply part, supplies the second gas, when supplying the second gas to the substrate,
wherein the controller configured to control at least one of a flow rate of the first purge gas supplied from the first gas supply part and a distance between the pedestal and the first gas supply part such that gas diffusion rather than a gas flow dominates gas transportation from the first gas supply part to the second gas supply part, and
wherein the controller, when $L_1$ represents a distance from an edge of the substrate to the second gas supply part, $S_1(x)$ represents a space cross-sectional area perpendicular to a flow of the first purge gas is made, $Q_1$ represents a flow rate of the first purge gas, $P_1$ represents a pressure in the process chamber, and $D_1$ represents a diffusion coefficient of the second gas relative to the first purge gas, configured to control at least one of the flow rate of the first purge gas $Q_1$ supplied from the first gas supply part and the space cross-sectional area $S_1(x)$ perpendicular to the flow of the first purge gas such that Peclet number $Pe_1$ calculated from the following formula is smaller than one

$$Pe_1 = \frac{Q_1}{D_1 \cdot P_1} \int_0^{L_1} \frac{1}{S_{1(x)}} dx$$

2. A plasma processing apparatus, comprising;
a process chamber;
a pedestal provided in the process chamber and configured to hold a substrate;
a first gas supply part configured to be able to supply a first gas from a location facing the pedestal;

a radio frequency power source configured to convert the first gas to plasma;
a shield part to block the first gas converted to plasma and provided around the pedestal;
a evacuation device configured to evacuate the process chamber through the shield part;
a second gas supply part configured to be able to supply a second gas to a space between the shield part and the evacuation device; and
a controller configured to control operation of the first gas supply part and the second gas supply part,
wherein the second gas supply part is configured to be able to supply a second purge gas,
wherein the controller configured to control the operation of the first gas supply part and the second gas supply part such that the first gas supply part supplies the first gas and that the second gas supply part supplies the second purge gas, when supplying the first gas to the substrate, and
wherein the controller, when $L_2$ represents a distance from an edge of the substrate to the second gas supply part, $S_2(x)$ represents a space cross-sectional area perpendicular to a flow of the first gas, $Q_2$ represents a flow rate of the first gas, $P_2$ represents a pressure in die process chamber, and $D_2$ represents a diffusion coefficient of the second purge gas relative to the first gas, configured to control at least one of the flow rate of the first gas $Q_2$ supplied from the first gas supply part and the space cross-sectional area $S_2(x)$ perpendicular to the flow of the first gas such that Peclet number $Pe_2$ calculated from the following formula is, greater than one $$Pe_2 = \frac{Q_2}{D_2 \cdot P_2} \int_0^{L_2} \frac{1}{S_{2(x)}} dx$$

3. The plasma processing apparatus as claimed in claim 1, wherein the second gas supply part is configured to be able to supply a second purge gas, and
wherein the controller configured to control the operation of the first gas supply part and the second gas supply part such that the first gas supply part supplies the first gas and that the second gas supply part supplies the second purge gas, when supplying the first gas to the substrate.

4. The plasma processing apparatus as claimed in claim 3, wherein the controller configured to control at least one of a flow rate of the first gas supplied from the first gas supply part and a distance between the pedestal and the first gas supply part such that a gas flow rather than gas diffusion dominates gas transportation from the first gas supply part to the second gas supply part.

5. The plasma processing apparatus as claimed in claim 1, wherein the second gas is a precursor gas.

6. The plasma processing apparatus as claimed in claim 2, wherein the second gas is a precursor gas.

* * * * *